(12) United States Patent
Geng et al.

(10) Patent No.: US 12,035,524 B2
(45) Date of Patent: Jul. 9, 2024

(54) CHANNEL STRUCTURES HAVING PROTRUDING PORTIONS IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Wanbo Geng, Wuhan (CN); Lei Xue, Wuhan (CN); Xiaoxin Liu, Wuhan (CN); Tingting Gao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 844 days.

(21) Appl. No.: 17/084,423

(22) Filed: Oct. 29, 2020

(65) Prior Publication Data
US 2022/0085055 A1    Mar. 17, 2022

Related U.S. Application Data

(63) Continuation of application No. PCT/CN2020/115213, filed on Sep. 15, 2020.

(51) Int. Cl.
*H01L 27/11582*   (2017.01)
*H10B 43/27*   (2023.01)
*H01L 21/311*   (2006.01)

(52) U.S. Cl.
CPC ......... *H10B 43/27* (2023.02); *H01L 21/31111* (2013.01)

(58) Field of Classification Search
CPC .............................. H10B 43/27; H10B 43/30
See application file for complete search history.

(56) References Cited

U.S. PATENT DOCUMENTS

| | | |
|---|---|---|
| 2009/0294828 A1 | 12/2009 | Ozawa et al. |
| 2010/0155810 A1 | 6/2010 | Kim et al. |
| 2011/0147823 A1 | 6/2011 | Kuk et al. |
| 2013/0270643 A1 | 10/2013 | Lee et al. |

(Continued)

OTHER PUBLICATIONS

International Search Report issued in corresponding International Application No. PCT/CN2020/115213, dated Jun. 23, 2021, 5 pages.

*Primary Examiner* — John A Bodnar
(74) *Attorney, Agent, or Firm* — BAYES PLLC

(57) ABSTRACT

Embodiments of three-dimensional (3D) memory devices and methods for forming the same are disclosed. In an example, a 3D memory device includes a substrate, a memory stack disposed on the substrate and including a plurality of interleaved conductive layers and dielectric layers, and a plurality of channel structures each extending vertically through the memory stack and having a plurality of protruding portions abutting the conductive layers and a plurality of normal portions abutting the dielectric layers. Each of the plurality of channel structures includes a blocking layer along a sidewall of the channel structure, and a storage layer over the blocking layer. The storage layer includes a plurality of charge trapping structures in the protruding portions of the channel structure, and a plurality of protecting structures in the normal portions of the channel structure and connecting the plurality of charge trapping structures.

18 Claims, 13 Drawing Sheets

(56) References Cited

U.S. PATENT DOCUMENTS

| | | | |
|---|---|---|---|
| 2017/0243879 A1 | 8/2017 | Yu et al. | |
| 2017/0271527 A1 | 9/2017 | Higuchi et al. | |
| 2017/0373086 A1* | 12/2017 | Pang | H01L 29/7926 |
| 2020/0273501 A1* | 8/2020 | Yun | H01L 21/8232 |
| 2020/0286915 A1 | 9/2020 | Cui | |
| 2021/0104535 A1* | 4/2021 | Yang | H01L 21/0217 |

* cited by examiner

CHANNEL STRUCTURES HAVING PROTRUDING PORTIONS IN THREE-DIMENSIONAL MEMORY DEVICE AND METHOD FOR FORMING THE SAME

CROSS-REFERENCE TO RELATED APPLICATIONS

This application is continuation of International Application No. PCT/CN2020/115213, filed on Sep. 15, 2020, entitled "CHANNEL STRUCTURES HAVING PROTRUDING PORTIONS IN THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack disposed on the substrate and including a plurality of interleaved conductive layers and dielectric layers, and a plurality of channel structures each extending vertically through the memory stack and having a plurality of protruding portions abutting the conductive layers and a plurality of normal portions abutting the dielectric layers. Each of the plurality of channel structures includes a blocking layer along a sidewall of the channel structure, and a storage layer over the blocking layer. The storage layer includes a plurality of charge trapping structures in the protruding portions of the channel structure, and a plurality of protecting structures in the normal portions of the channel structure and connecting the plurality of charge trapping structures.

In another example, a 3D memory device includes a substrate, a memory stack disposed on the substrate and including a plurality of interleaved conductive layers and dielectric layers, and a plurality of channel structures each extending vertically through the memory stack and having a plurality of protruding portions abutting the conductive layers and a plurality of normal portions abutting the dielectric layers. Each of the plurality of channel structures includes a blocking layer along a sidewall of the channel structure, and a storage layer over the blocking layer. The storage layer includes a plurality of charge trapping structures in the protruding portions of the channel structure, and a plurality of protecting structures in the normal portions of the channel structure. A thickness of each of the plurality of charge trapping structures is greater than a thickness of each of the plurality of protecting structures.

In still another example, a method for forming a 3D memory device is disclosed. A dielectric stack is formed above a substrate, and the dielectric stack includes a plurality of interleaved dielectric layers and sacrificial layers. An opening extending vertically through the dielectric stack is formed. Parts of the sacrificial layers abutting the opening are removed to form a plurality of recesses. A blocking layer and a storage layer are sequentially formed along sidewalls of the opening and the plurality of recesses. Part of the storage layer is oxidized. The oxidized part of the storage layer is removed, such that a remainder of the storage layer is continuous over the blocking layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
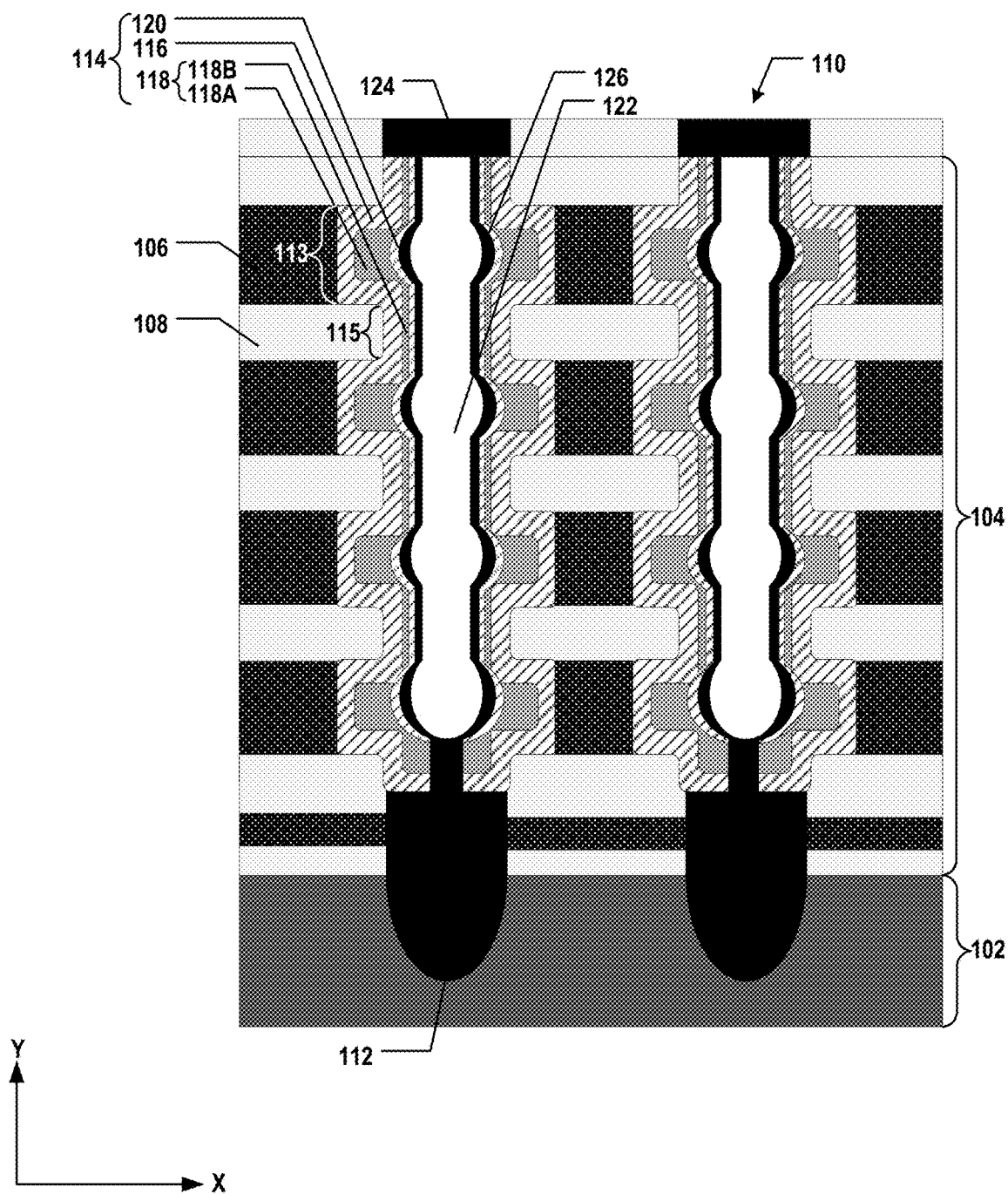
FIG. 1 illustrates a side view of a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense.

Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Charge trapping is a semiconductor memory technology used in some memory devices, such as 3D NAND memory devices, which uses a silicon nitride film as the storage layer to store electrons. Because the charge trapping layer, e.g., a silicon nitride film, is usually not isolated but shared in a memory string, the charge spreading (also known as charge migration) between adjacent memory cells may become a serious problem for data retention properties and disturb issues as the 3D memory devices continue scaling up vertically and the cell size and spacing shrink aggressively.

One approach to avoid the charge migration issue in the charge trapping layer is to cut the continuous silicon nitride film into separate portions for each memory cell, thereby physically preventing charge spreading between memory cells. Wet etching is usually used to etch the deposited silicon nitride film until the parts not abutting the memory cell gates are completely removed, leaving separate charge trapping structures from the continuous silicon nitride film. However, the high aspect ratio of channel holes creates non-uniformity of wet etching rate at different depths of the channel holes, thereby causing a non-uniform thickness distribution of the remaining charge trapping structures at different depths. Moreover, the etch stop of wet etching is known to be difficult to control, which also causes relatively large roughness of the remaining charge trapping structures. As a result, the process window is limited, and the performance variation between memory cells is enlarged.

Various embodiments in accordance with the present disclosure provide an improved method for forming channel structures having protruding portions in a 3D memory device, which can be more easily controlled to pattern the charge trapping structures of the storage layer. In some embodiments, the etching process of the storage layer having silicon nitride is replaced with an oxidation process that turns part of the storage layer into native oxide, followed by an etching process to completely remove the native oxide. As an oxidation process, such as in-situ steam generation (ISSG), can be more easily controlled than the wet etching process and has a better uniformity at different depths of the channel hole than the wet etching process, the resulting charge trapping structures can have a better thickness uniformity in memory cells at different depths as well as a smaller roughness.

In some embodiments, the oxidation process is controlled such that the silicon nitride film outside of the protruding portions of the channel structure is not completely oxidized, leaving a thin layer of silicon nitride (e.g., 2-3 nm) connecting the adjacent charge trapping structures, which can act as a protecting structure to protect the silicon oxide layers of the dielectric stack underneath when removing the native oxide. As a result, the resulting storage layer can still be a continuous layer with varying thicknesses at the charge trapping structures and the protection structures. The thin protection structures can still effectively suppress the charge migration between memory cells.

FIG. 1 illustrates a side view of a cross-section of an exemplary 3D memory device 100, according to some embodiments of the present disclosure. The 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. It is noted that x- and y-axes are included in FIG. 1 to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing the spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in an array of NAND memory strings extending vertically above substrate 102. Each NAND memory string can be in the form of a channel structure 110 that extends through a plurality of pairs each including a conductive layer 106 and a dielectric layer 108 (referred to herein as "conductive/dielectric layer pairs"). The stacked conductor/dielectric layer pairs are also referred to herein as a "memory stack" 104. In some embodiments, a pad layer (not shown), such as a silicon oxide layer, is formed between substrate 102 and memory stack 104. The number of the conductive/dielectric layer pairs in memory stack 104 (e.g., 32, 64, 96, 128, 160, 192, 224, 256, etc.) can determine the number of memory cells in 3D memory device 100. Memory stack 104 can include a plurality of interleaved conductive layers 106 and dielectric layers 108. Conductive layers 106 and dielectric layers 108 in memory stack 104 can alternate in the vertical direction. Conductive layers 106 can include conductive materials including, but not limited to, tungsten (W), cobalt (Co), copper (Cu), aluminum (Al), polysilicon, doped silicon, silicides, or any combination thereof. Each conductive layer 106 can include a gate electrode (gate line) surrounded by an adhesive layer and a gate dielectric layer. The gate electrode of conductive layer 106 can extend laterally as a word line, ending at one or more staircase structures of memory stack 104. Dielectric layers 108 can include dielectric materials including, but not limited to, silicon oxide, silicon nitride, silicon oxynitride, or any combination thereof. Although not shown, it is understood that in some embodiments, memory stack 104 has a multiple-deck architecture, which includes a plurality of memory decks stacked over one another, to increase the number of the conductor/dielectric layer pairs.

As shown in FIG. 1, channel structure 110 can include a semiconductor plug 112 in the lower portion (e.g., at the lower end) of channel structure 110. As used herein, the "upper end" of a component (e.g., channel structure 110) is the end farther away from substrate 102 in the y-direction, and the "lower end" of the component (e.g., channel structure 110) is the end closer to substrate 102 in the y-direction when substrate 102 is positioned in the lowest plane of 3D memory device 100. Semiconductor plug 112 can include a single crystalline semiconductor material (also known as "monocrystalline semiconductor material"), such as single crystalline silicon, which in some instances is epitaxially grown from substrate 102 in any suitable directions. In a single crystalline material, the crystal lattice of the entire sample can be continuous and unbroken to the edges of the sample, with no grain boundaries. In some embodiments, semiconductor plug 112 includes single crystalline silicon, the same material of substrate 102. In other words, semiconductor plug 112 can include an epitaxially-grown semiconductor layer that is the same as the material of substrate 102. For example, substrate 102 may be a silicon substrate, and semiconductor plug 112 may be a single crystalline silicon plug. Semiconductor plug 112 can function as a channel controlled by a source select gate of channel structure 110.

As shown in FIG. 1, above semiconductor plug 112, channel structure 110 can have interleaved a plurality of protruding portions 113 and a plurality of normal portions 115. Protruding portions 113 of channel structure 110 abut conductive layers 106 of memory stack 104, and normal portions 115 of channel structure 110 abut dielectric layers 108 of memory stack 104, according to some embodiments. In some embodiments, compared with normal portions 115, each protruding portion 113 protrudes into a respective conductive layer 106 laterally (e.g., in the x-direction in FIG. 1). That is, the lateral dimension (e.g., in the x-direction in FIG. 1) of protruding portion 113 can be greater than the lateral dimension of normal portion 115 of channel structure 110. As a result, in some embodiments, the sidewall of channel structure 110 has a serpentine profile in the side view, as shown in FIG. 1.

As shown in FIG. 1, channel structure 110 can also include an opening filled with semiconductor material(s) (e.g., as a semiconductor channel 126) and dielectric material(s) (e.g., as a memory film 114). In some embodiments, memory film 114 is a composite layer above semiconductor plug 112 and along the sidewall of channel structure 110. It is understood that in some examples, the bottom of memory film 114 may further extend laterally over the top surface of semiconductor plug 112. In some embodiments, memory film 114 includes a blocking layer 116, a storage layer 118, and a tunneling layer 120 from the sidewall toward the center of channel structure 110 in this order.

Blocking layer 116 (also known as "blocking oxide") can be formed over and along the sidewall of channel structure 110. In some embodiments, blocking layer 116 follows the serpentine profile of the sidewall of channel structure 110 in the side view. In some embodiments, the thickness of blocking layer 116 is nominally the same along the sidewall of channel structure 110. In other words, blocking layer 116 can have a nominally uniform thickness over the sidewall of channel structure 110. Blocking layer 116 is continuous in protruding portions 113 and in normal portions 115, according to some embodiments. Thus, the thicknesses of blocking layer 116 in protruding portion 113 and normal portion 115 of channel structure 110 can be nominally the same. Blocking layer 116 can include silicon oxide, silicon oxynitride, high dielectric constant (high-k) dielectrics, or any combination thereof. In some embodiments, blocking layer 116 includes silicon oxide. In some embodiments, a gate dielectric layer (not shown) is disposed laterally between blocking layer 116 and conductive layer 106. For example, the gate dielectric layer may include high-k dielectrics including, but not limited to, aluminum oxide ($Al_2O_3$), hafnium oxide ($HfO_2$), zirconium oxide ($ZnO_2$), tantalum oxide ($Ta_2O_5$), etc.

Storage layer 118 (also known as "storage nitride") can be formed over blocking layer 116. Storage layer 118 can include silicon nitride, silicon oxynitride, silicon, or any combination thereof. In some embodiments, storage layer 118 includes silicon nitride. Different from known storage layers described above, storage layer 118 includes two types of structures with different thicknesses (e.g., in the x-direction in FIG. 1): a plurality of charge trapping structures 118A in protruding portions 113 of channel structure 110, and a plurality of protecting structures 118B in normal portions 115 of channel structure 110, according to some embodiments.

Each charge trapping structure 118A in protruding portion 113 can be coplanar with a respective conductive layer 106 (e.g., a gate electrode of a memory cell) and can be affected by the electric field generated by conductive layer 106. As a result, charge trapping structure 118A can store charges, for example, electrons or holes from semiconductor channel 126. The storage or removal of charge in charge trapping structure 118A can impact the on/off state and/or the conductance of semiconductor channel 126. In contrast, each protecting structure 118B in normal portion 115 of channel structure 110 is coplanar with a respective dielectric layer 108 (e.g., a gate-to-gate dielectric) and may not be affected by the electric field generated by conductive layer 106, according to some embodiments. Instead of storing charges, protecting structure 118B can connect adjacent charge trapping structures 118A and protect blocking layer 116 in normal portions 115 of channel structure 110 during the fabrication process of 3D memory device 100, as described below in detail. In some embodiments, protecting structures 118B in normal portions 115 of channel structure 110 connect charge trapping structures 118A in protruding portions 113 of channel structure 110, such that storage layer 118 is continuous over blocking layer 116, e.g., in contact with the entire inside surface of blocking layer 116.

It is understood that the thickness of each protecting structure 118B of storage layer 118 needs to be small enough to suppress the charge mitigation between adjacent charge trapping structures 118A of storage layer 118. On the other hand, the thickness of protecting structure 118B of storage layer 118 cannot be too small in order to protect blocking layer 116 underneath during the fabrication process. In some embodiments, the thickness of protecting structure 118B is between about 1 nm and about 5 nm, such as between 1 nm and 5 nm (e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). In some embodiments, the thickness of protecting structure 118B is about 2 nm to about 3 nm, such as 2 nm to 3 nm. The thickness of charge trapping structure 118A can be greater than the thickness of protecting structure 118B due to the greater lateral dimension of protruding portion 113 of channel structure 110 than that of normal portion 115, which can allow the storage of charge herein. In some embodiments, the thickness of charge trapping structure 118A is between about 10 nm and about 20 nm, such as between 10 nm and 20 nm (e.g., 10 nm, 11 nm, 12 nm, 13 nm, 14 nm, 15 nm, 16 nm, 17 nm, 18 nm, 19 nm, 20 nm, e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values).

Tunneling layer 120 (also known as "tunnel oxide") can be formed over storage layer 118. In some embodiments, the thickness of tunneling layer 120 is nominally the same over storage layer 118. Tunneling layer 120 is continuous in protruding portions 113 and in normal portions 115, according to some embodiments. Thus, the thicknesses of tunneling layer 120 in protruding portion 113 and normal portion 115 of channel structure 110 can be nominally the same. Charges, for example, electrons or holes from semiconductor channel 126 can tunnel through tunneling layer 120 to charge trapping structures 118A of storage layer 118. Tunneling layer 120 can include silicon oxide, silicon oxynitride, or any combination thereof. In some embodiments, blocking layer 116 includes silicon oxide, storage layer 118 includes silicon nitride, and tunneling layer 120 includes silicon oxide. Memory film 114 thus may be referred to as an "ONO" memory film for charge trapping-type of 3D NAND Flash memory.

Semiconductor channel 126 can be formed over tunneling layer 120. In some embodiments, the thickness of semiconductor channel 126 is nominally the same over tunneling layer 120. Semiconductor channel 126 is continuous in protruding portions 113 and in normal portions 115, according to some embodiments. Thus, the thicknesses of semiconductor channel 126 in protruding portion 113 and normal portion 115 of channel structure 110 can be nominally the same. Semiconductor channel 126 can provide charges, for example, electrons or holes, to charge trapping structures 118A of storage layer 118, tunneling through tunneling layer 120. Semiconductor channel 126 can include silicon, such as amorphous silicon, polysilicon, or single crystalline silicon. In some embodiments, semiconductor channel 126 includes polysilicon. As shown in FIG. 1, in some embodiments, a bottom protruding portion of semiconductor channel 126 extends vertically through the bottom of memory film 114 to be in contact with semiconductor plug 112, such that semiconductor plug 112 is electrically connected to semiconductor channel 126. In some embodiments, the remaining space of channel structure 110 is partially or fully filled with a capping layer 122 (with or without an air gap therein) including dielectric materials, such as silicon oxide. Capping layer 122 may be formed over semiconductor channel 126.

In some embodiments, channel structure 110 further includes a channel plug 124 in the upper portion (e.g., at the upper end) of channel structure 110. Channel plug 124 can be above and in contact with the upper end of semiconductor channel 126 to increase the contact area for bit line contact. Channel plug 124 can include semiconductor materials (e.g., polysilicon). By covering the upper end of channel structure 110 during the fabrication of 3D memory device 100, channel plug 124 can function as an etch stop layer to prevent etching of dielectrics filled in channel structure 110, such as silicon oxide and silicon nitride. In some embodiments, channel plug 124 also functions as part of the drain of the NAND memory string.

Although not shown in FIG. 1, it is understood that any other suitable components may be included as part of 3D memory device 100. For example, gate line slits, array common sources (ACSs), and local contacts, such as bit line contacts, word line contacts, and source line contacts, may be included in 3D memory device 100 for pad-out, i.e., electrically connecting channel structures 110 for metal routing to interconnects (e.g., middle-end-of-line (MEOL) interconnects and BEOL interconnects). In some embodiments, 3D memory device 100 further includes peripheral circuits, such as any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

FIGS. 2A-2J illustrate an exemplary fabrication process for forming a 3D memory device, according to some embodiments of the present disclosure. FIG. 3 illustrates a flowchart of an exemplary method 300 for forming a 3D memory device, according to some embodiments of the present disclosure. Examples of the 3D memory device depicted in FIGS. 2A-2J and FIG. 3 includes 3D memory device 100 depicted in FIG. 1. FIGS. 2A-2J and FIG. 3 will be described together. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a dielectric stack is formed above a substrate. The substrate can be a silicon substrate. The dielectric stack can include a plurality of interleaved dielectric layers and sacrificial layers.

Figure 2A:
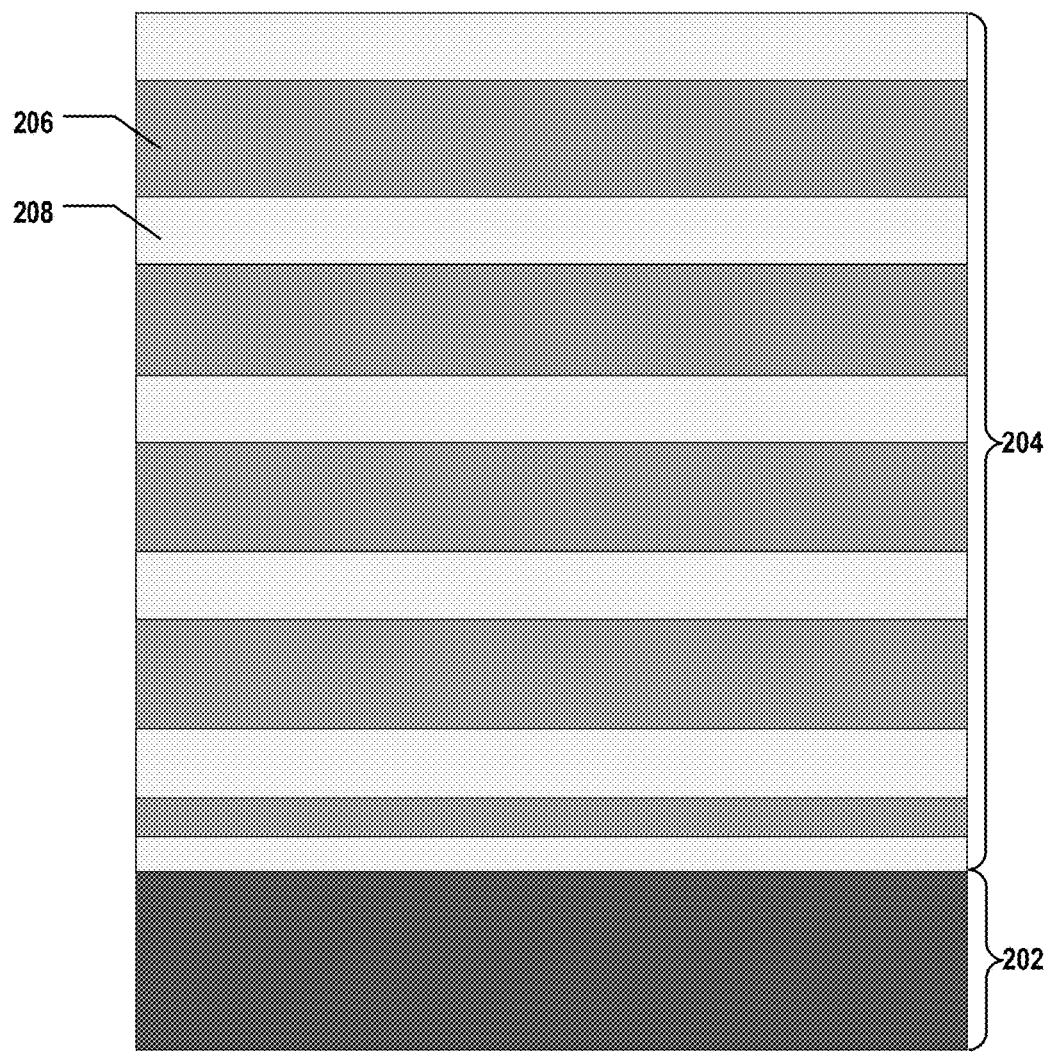
FIGS. 2A-2J illustrate an exemplary fabrication process for forming a 3D memory device, according to some embodiments of the present disclosure.
Figure 3:
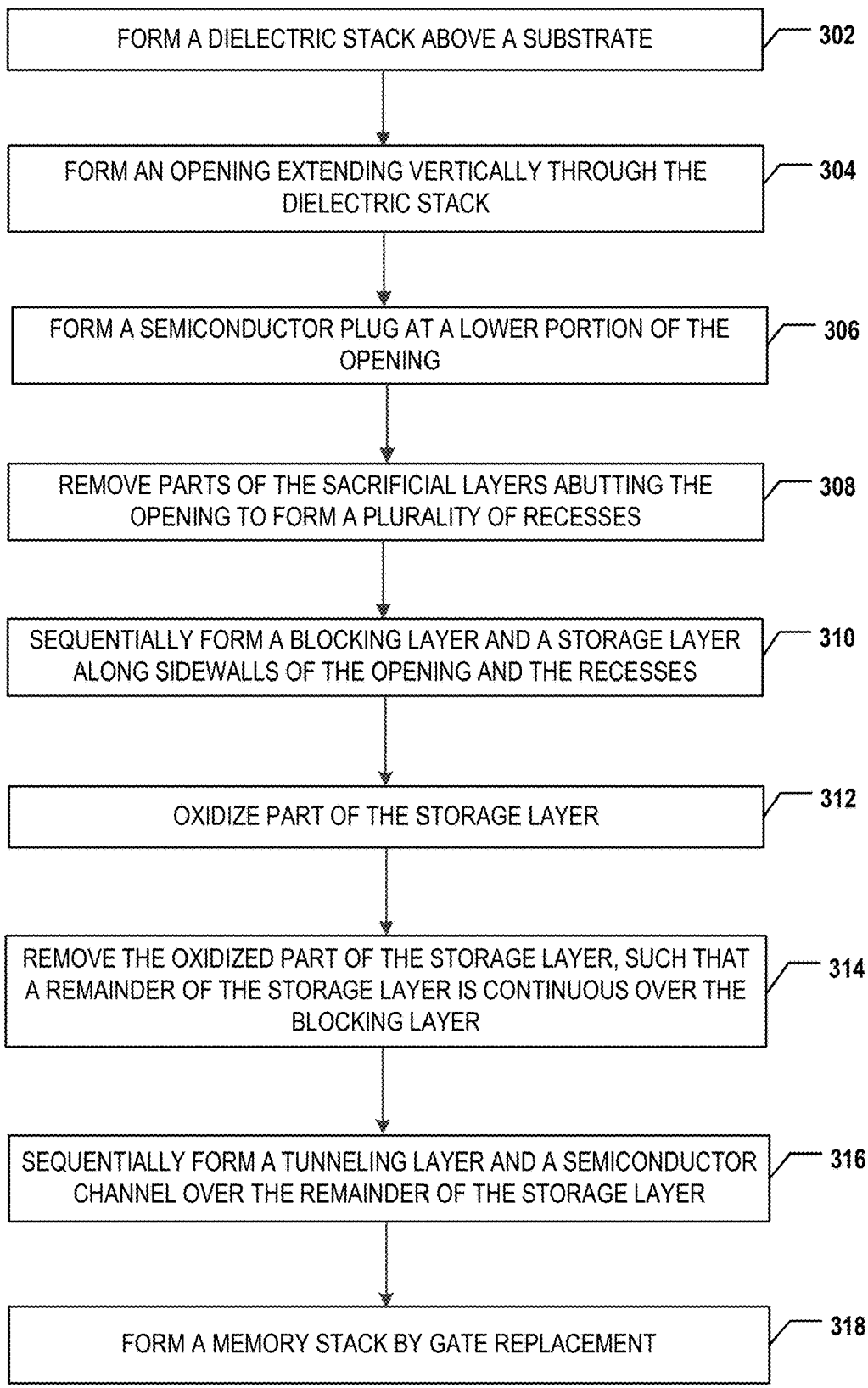
FIG. 3 illustrates a flowchart of an exemplary method for forming a 3D memory device, according to some embodiments of the present disclosure.

As illustrated in FIG. 2A, a dielectric stack 204 including interleaved first dielectric layers (referred to herein as "sacrificial layers" 206) and second dielectric layers 208 (together referred to herein as "dielectric layer pairs") are formed above a silicon substrate 202. In some embodiments, a pad layer (not shown) is formed between dielectric stack 204 and silicon substrate 202 by depositing dielectric materials, such as silicon oxide, or thermal oxidation, on silicon substrate 202 prior to the formation of dielectric stack 204.

Dielectric layers 208 and sacrificial layers 206 can be alternatively deposited above silicon substrate 202 to form dielectric stack 204. In some embodiments, each dielectric layer 208 includes a layer of silicon oxide, and each sacrificial layer 206 includes a layer of silicon nitride. Dielectric stack 204 can be formed by one or more thin film deposition processes including, but not limited to, chemical vapor deposition (CVD), physical vapor deposition (PVD), atomic layer deposition (ALD), or any combination thereof.

Figure 2B:
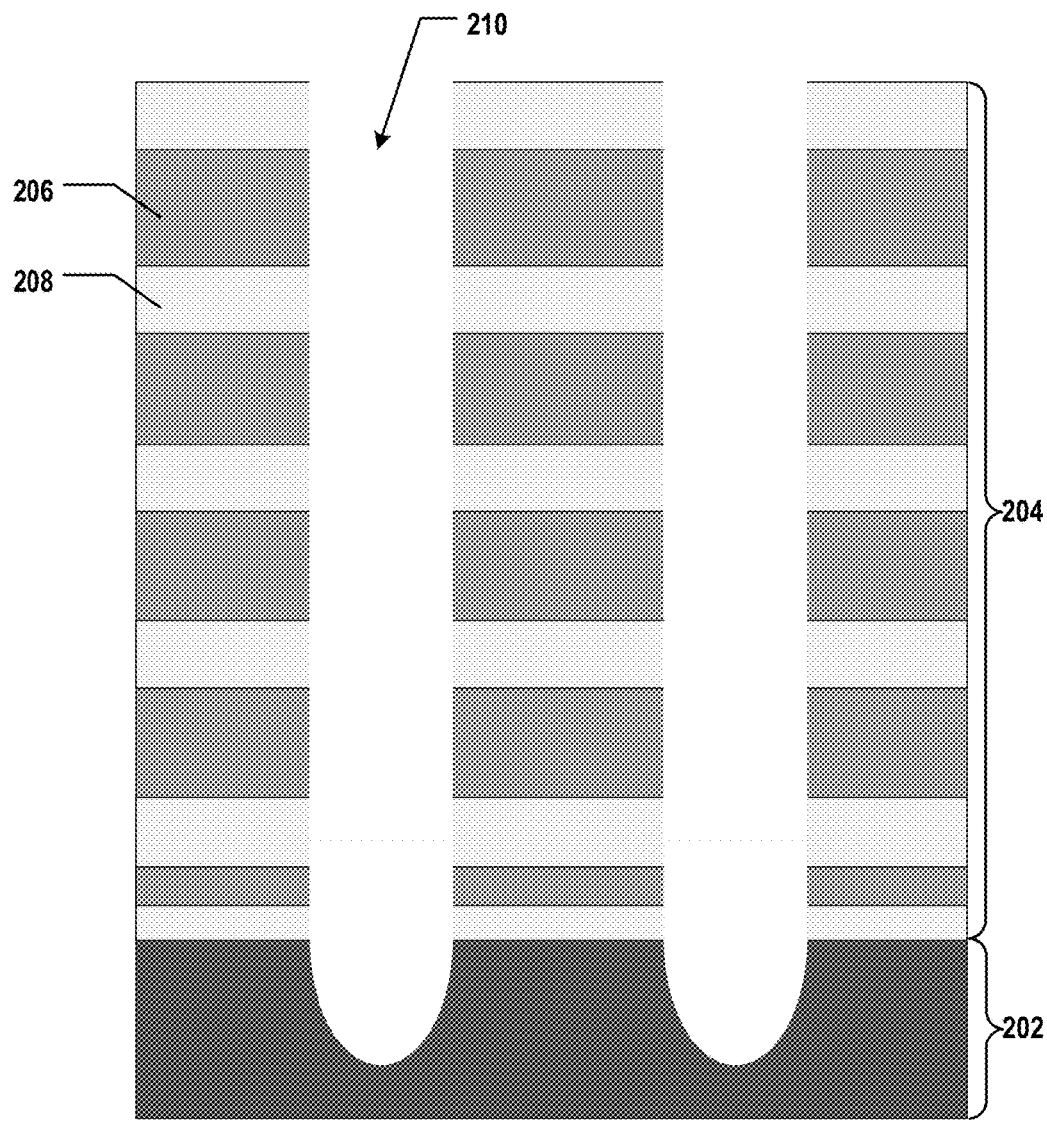
Figure 2B:

Method 300 proceeds to operation 304, as illustrated in FIG. 3, in which an opening is formed extending vertically through the dielectric stack. As illustrated in FIG. 2B, an opening 210 is formed extending vertically through dielectric stack 204. In some embodiments, a plurality of openings 210 are formed through dielectric stack 204, such that each opening 210 becomes the location for growing an individual channel structure in the later process. In some embodiments, fabrication processes for forming opening 210 include wet etching and/or dry etching, such as deep-ion reactive etching (DRIE). In some embodiments, opening 210 extends further through the top portion of silicon substrate 202. The etching process through dielectric stack 204 may not stop at the top surface of silicon substrate 202 and may continue to etch part of silicon substrate 202. In some embodiments, a separate etching process is used to etch part of silicon substrate 202 after etching through dielectric stack 204.

Figure 2C:
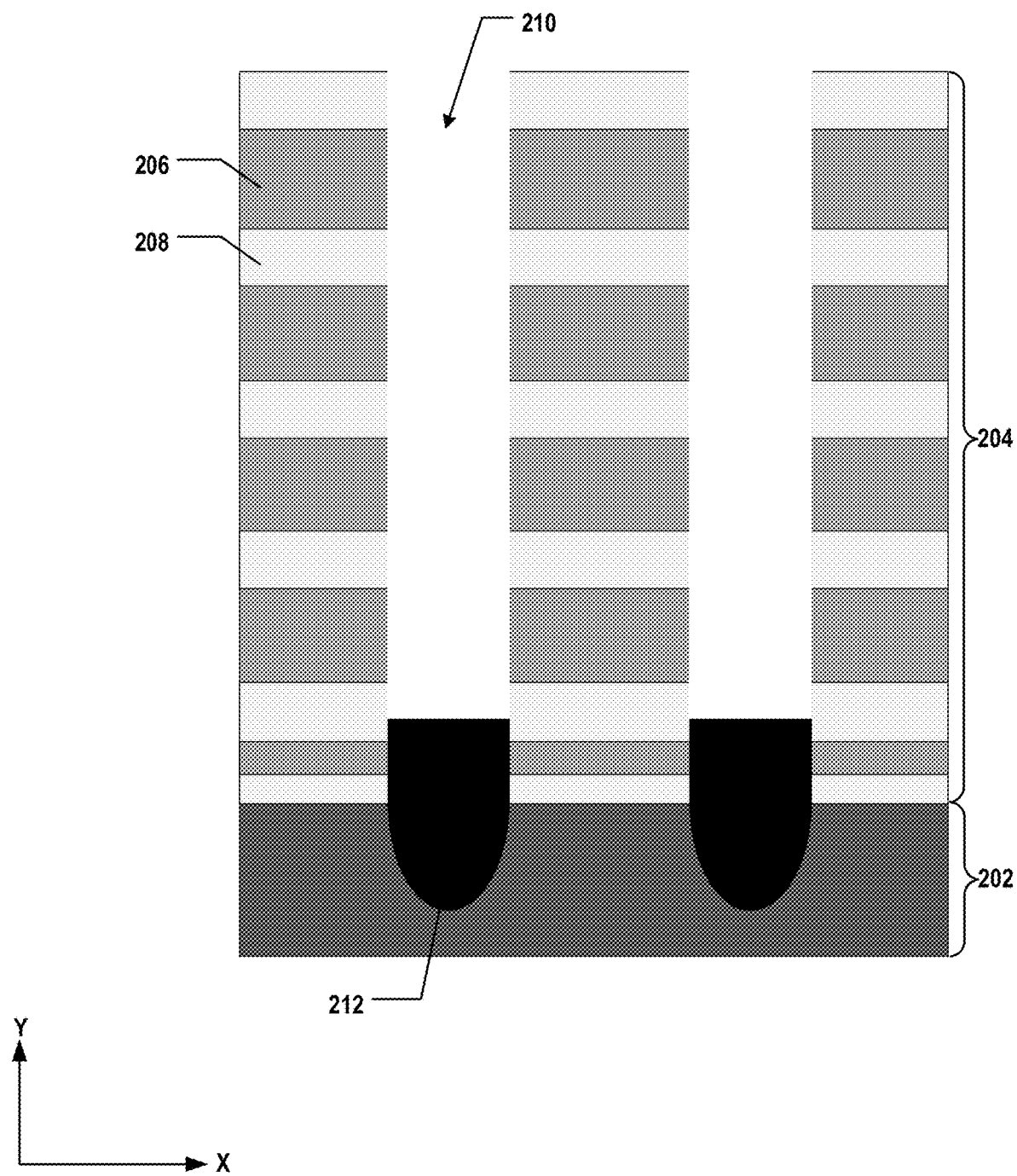

Method 300 proceeds to operation 306, as illustrated in FIG. 3, in which a semiconductor plug is formed at a lower portion of the opening. As illustrated in FIG. 2C, a single crystalline silicon plug 212 can further be formed by selectively filling the lower portion of opening 210 with single crystalline silicon epitaxially grown from silicon substrate 202 in any suitable direction (e.g., from the bottom surface and/or side surface). The fabrication processes for growing single crystalline silicon plug 212 can include, but not limited to, vapor-phase epitaxy (VPE), liquid-phase epitaxy (LPE), molecular-beam epitaxy (MPE), or any combinations thereof.

Method 300 proceeds to operation 308, as illustrated in FIG. 3, in which parts of the sacrificial layers abutting the opening are removed to form a plurality of recesses. In some embodiments, to remove the parts of the sacrificial layers, the parts of the sacrificial layers are wet etched selective to the dielectric layers.

Figure 2D:
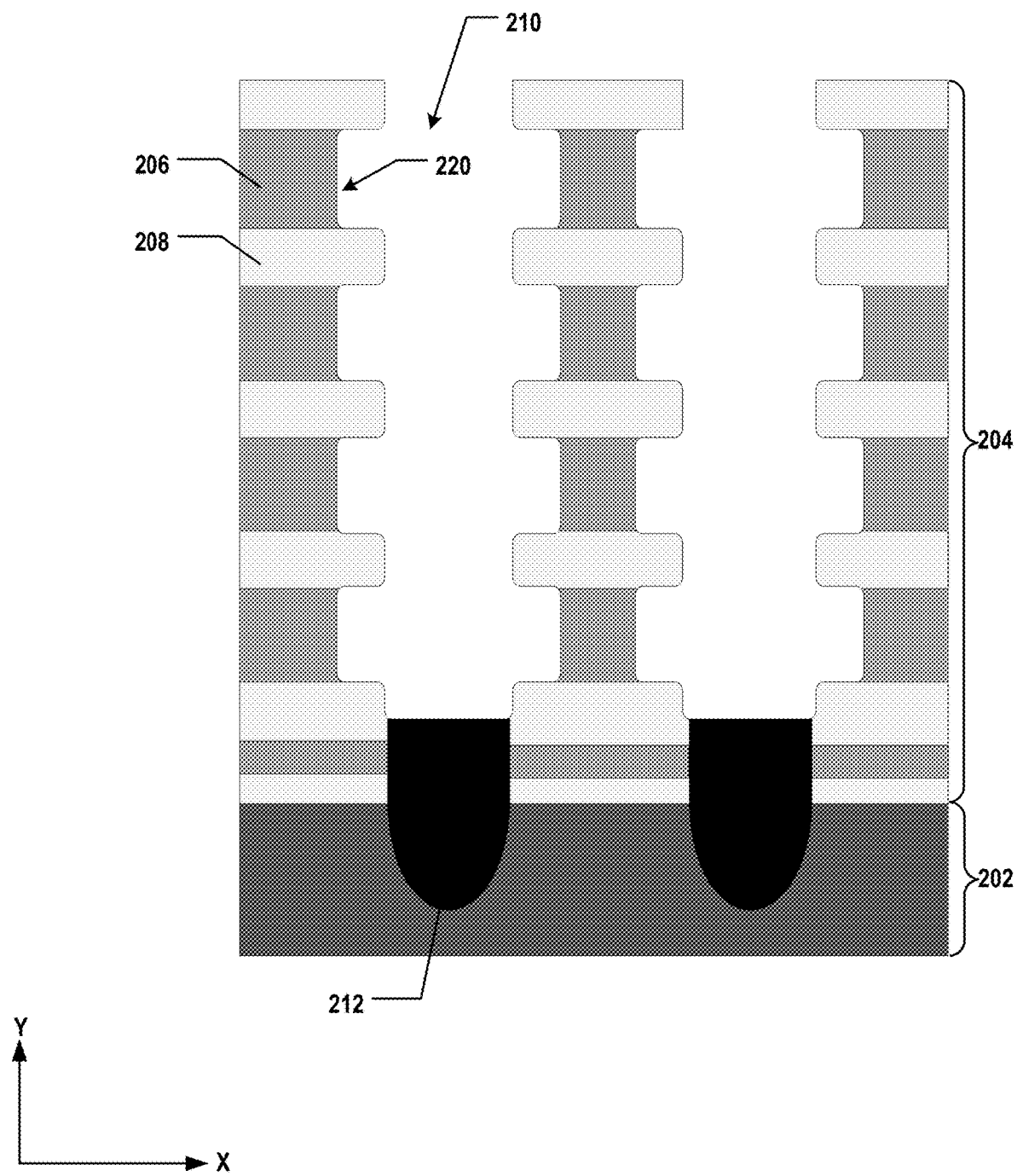

As shown in FIG. 2D, a plurality of recesses 220 are formed by removing parts of sacrificial layers 206 abutting the sidewall of opening 210. Recesses 220 are formed laterally between sacrificial layers 206 and opening 210, according to some embodiments. Recesses 220 can be formed by etching back sacrificial layers 206 using wet etching selective to dielectric layers 208 through opening 210. In some embodiments in which sacrificial layers 206 include silicon nitride and dielectric layers 208 include silicon oxide, a wet etchant including phosphoric acid applied through opening 210 to etch parts of sacrificial layers 206 abutting opening 210 to recesses 220. By controlling the etch rate and/or etch time, only parts of sacrificial layers 206 are etched with a desired lateral dimension, e.g., in the x-direction, according to some embodiments. It is understood that in some examples, the wet etching process for forming recesses 220 may be part of a cleaning process prior to forming single crystalline silicon plug 212. That is, single crystalline silicon plug 212 may be formed after the formation of recesses 220.

Method 300 proceeds to operation 310, as illustrated in FIG. 3, in which a blocking layer and a storage layer are sequentially formed along sidewalls of the opening and the plurality of recesses. In some embodiments, the thickness of the blocking layer is nominally the same along the sidewalls of the opening and the plurality of recesses, and the thickness of the storage layer is nominally the same along the sidewalls of the opening and the plurality of recesses. The total of the thicknesses of the blocking layer and the storage layer can be nominally one half of the depth of each of the plurality of recesses.

Figure 2E:
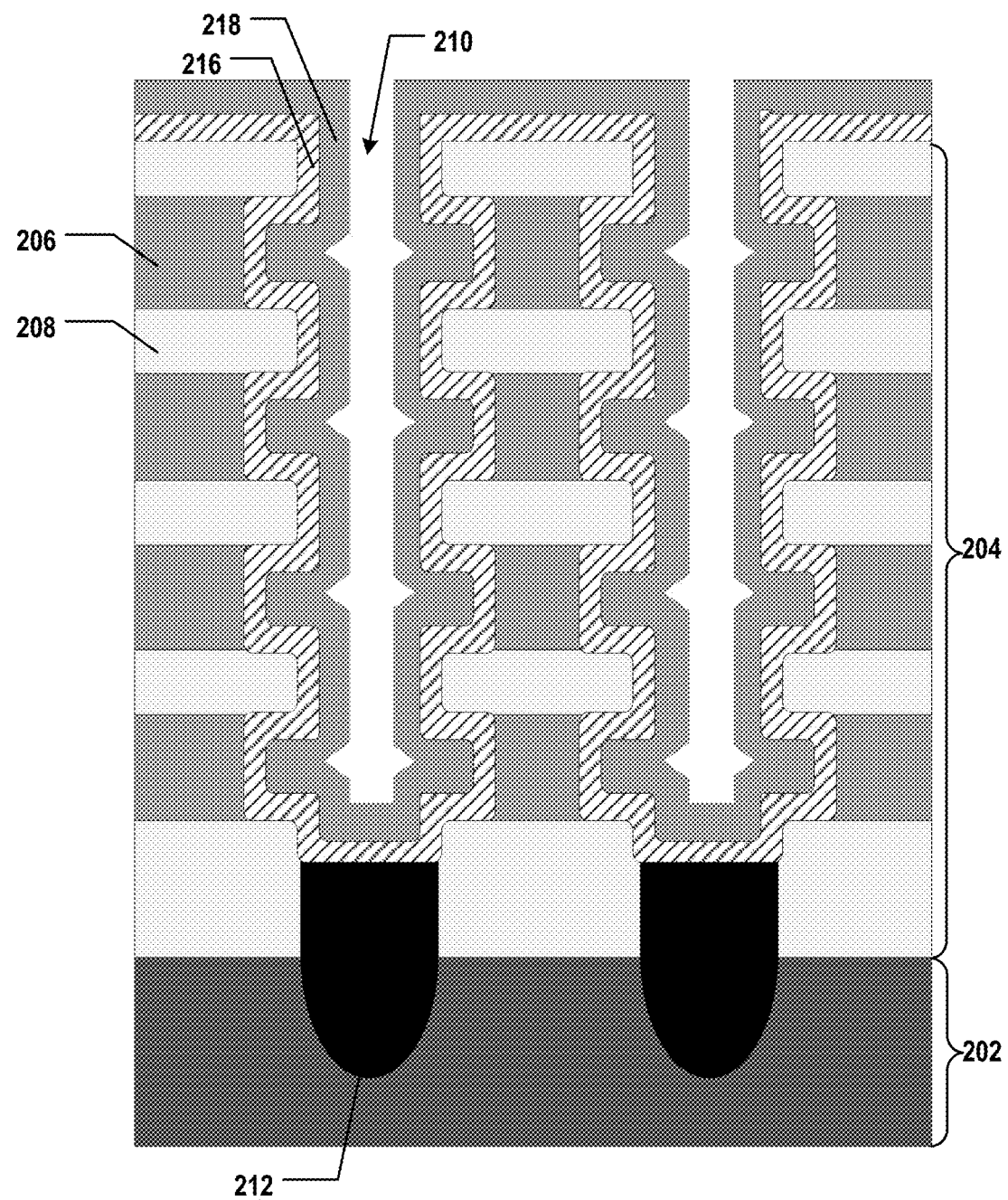

As illustrated in FIG. 2E, a blocking layer 216 and a storage layer 218 are sequentially formed on single crystalline silicon plug 212 and along the sidewalls of opening 210 and recesses 220, which have a serpentine profile (in FIG. 2D). In some embodiments, blocking layer 216 and storage layer 218 can be formed by sequentially depositing a layer of silicon oxide and a layer of silicon oxide using one or more thin film deposition processes, such as ALD, CVD, PVD, any other suitable processes, or any combination thereof through opening 210. In some embodiments, blocking layer 216 is formed by depositing a layer of silicon nitride, followed by an oxidation process to turn the layer of silicon nitride into silicon oxide. In some embodiments, an ALD process is used to precisely control the thickness of each of blocking layer 216 and storage layer 218. For example, the thickness of blocking layer 216 may be nominally the same along the sidewalls of opening 210 and recesses 220, and the thickness of storage layer 218 is nominally the same along the sidewalls of opening 210 and recesses 220 as well. In some embodiments, the total thickness of blocking layer 216 and storage layer 218 is nominally one half of the depth of each recess 220, e.g., in the y-direction in FIG. 2E, to fully fill recess 220 in the vertical direction. On the other hand, blocking layer 216 and storage layer 218 may also fully fill recess 220 in the lateral direction, e.g., the x-direction in FIG. 2E. In some embodiments, the thickness of storage layer 218 is between about 5 nm and about 20 nm, such as between 5 nm and 20 nm (e.g., 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, any range bounded by the lower end by any of these values, or in any range defined by any two of these values).

Method 300 proceeds to operation 312, as illustrated in FIG. 3, in which part of the storage layer is oxidized. In some embodiments, oxidizing is performed by at least one of thermal oxidation or chemical oxidation. The thermal oxidation can include ISSG.

Figure 2F:
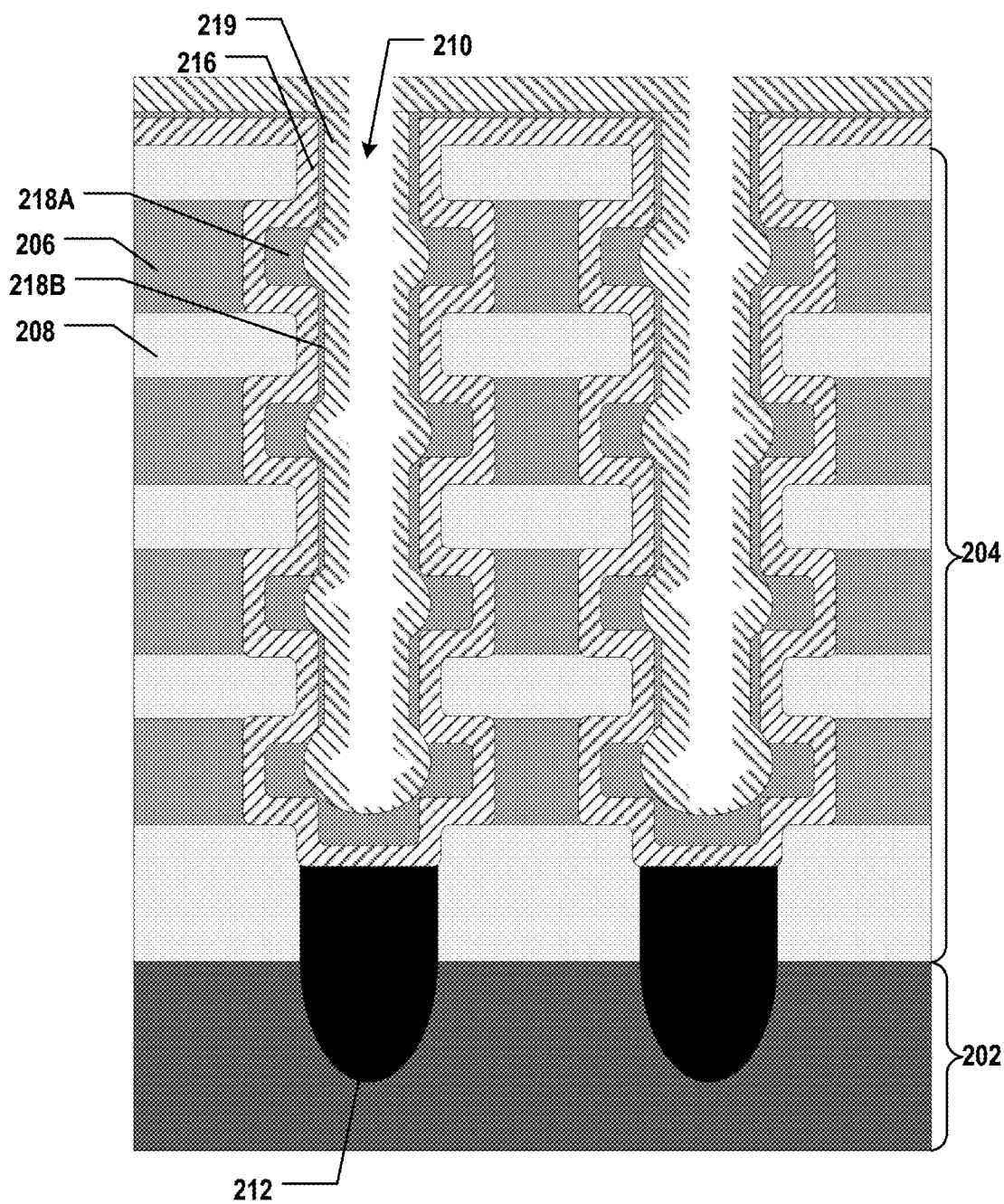

As illustrated in FIG. 2F, part of storage layer 218 is oxidized to form native oxide 219 (the oxidized part of storage layer 218). The oxidation process can be performed by a thermal oxidation process and or a chemical oxidation process. In some embodiments in which storage layer 218 includes silicon nitride, native oxide 219 includes silicon oxide. It is understood that depending on the oxidization processes (e.g., the extent to which nitrogen atoms and ions are removed from the native oxide), native oxide 219 can be entirely silicon oxide, entirely silicon oxynitride, and a mixture of silicon oxide and silicon oxynitride. In some embodiments, the part of storage layer 218 is oxidized by a thermal oxidation process. Either dry oxidation using molecular oxygen as the oxidant or wet oxidation using water vapor as the oxidant can be used to form native oxide 219 at a temperature, for example, not greater than about 850° C. For example, the thermal oxidation may include an ISSG process, which uses oxygen gas and hydrogen gas to create water in the form of steam.

The oxidation process can be performed in a controlled manner such that only part of storage layer 218 is oxidized, leaving the remainder of storage layer 218 remains intact. The thickness of the resulting native oxide 219 (and the remainder of storage layer 218) can be controlled by the thermal oxidation temperature and/or time. In some embodiments, the part of storage layer 218 is oxidized by a chemical oxidation process, for example, including ozone. In some embodiments, the wet chemical is a mixture of hydrofluoric acid and ozone (e.g., FOM). The thickness of resulting native oxide 219 can be controlled by the wet chemical compositions, temperature, and/or time. It is understood that the oxidation rates of storage layer 218 may vary at different parts thereof, for example, slower in recesses 220 (abutting sacrificial layers 206) and faster outside recesses 220 (in FIG. 2D, abutting dielectric layers 208) and along the sidewall of opening 210, due to the convex and concave structures in recesses 220. As a result, the sidewall roughness of the remainder of storage layer 218 may be reduced after the oxidation process.

In some embodiments, the oxidization process is controlled such that the remainder of storage layer 218 after oxidation includes two portions with different thicknesses (e.g., in the x-direction): a plurality of charge trapping structures 218A in recesses 220 and abutting sacrificial layer 206, and a plurality of protecting structures 218B outside of recesses 220 and abutting dielectric layers 208. The thickness of charge trapping structures 218A can be greater than that of protecting structure 218B due to recesses 220. In some embodiments, the oxidation process is controlled to leave protecting structures 218B of the remainder of storage layer 218 having the thickness of about 2 nm to about 3 nm, which can serve as the etch stop layer to protect parts of blocking layer 216 underneath in the later processes as described below in detail. The remainder of storage layer 218 after oxidation remains a continuous layer with non-uniform thicknesses over blocking layer 216, according to some embodiments. In some embodiments, to precisely control the oxidation thickness (and the thickness of the remainder of storage layer 218) as described, multiple oxidation processes are performed with a relatively small oxidation thickness increment each time.

Method 300 proceeds to operation 314, as illustrated in FIG. 3, in which the oxidized part of the storage layer is removed, such that a remainder of the storage layer is continuous over the blocking layer. In some embodiments, to remove the oxidized part of the storage layer, the oxidized part of the storage layer is wet etched selective to the remainder of the storage layer. In some embodiments, the storage layer includes silicon nitride, and an etchant used by the wet etching includes hydrofluoric acid. In some embodiments, the remainder of the storage layer includes a plurality of charge trapping structures in the plurality of recesses, and a plurality of protecting structures outside of the recesses.

Figure 2G:
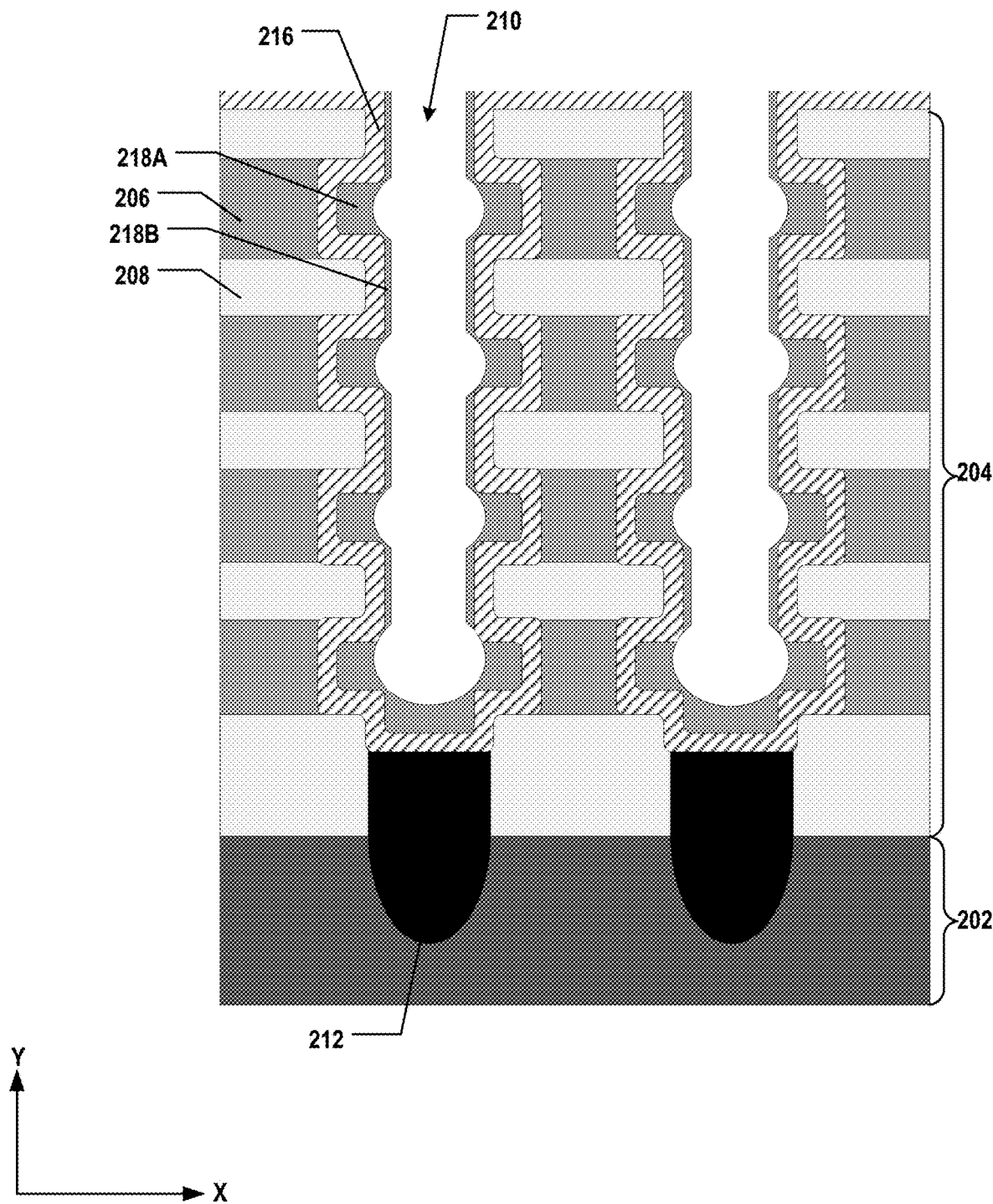
Figure 4:
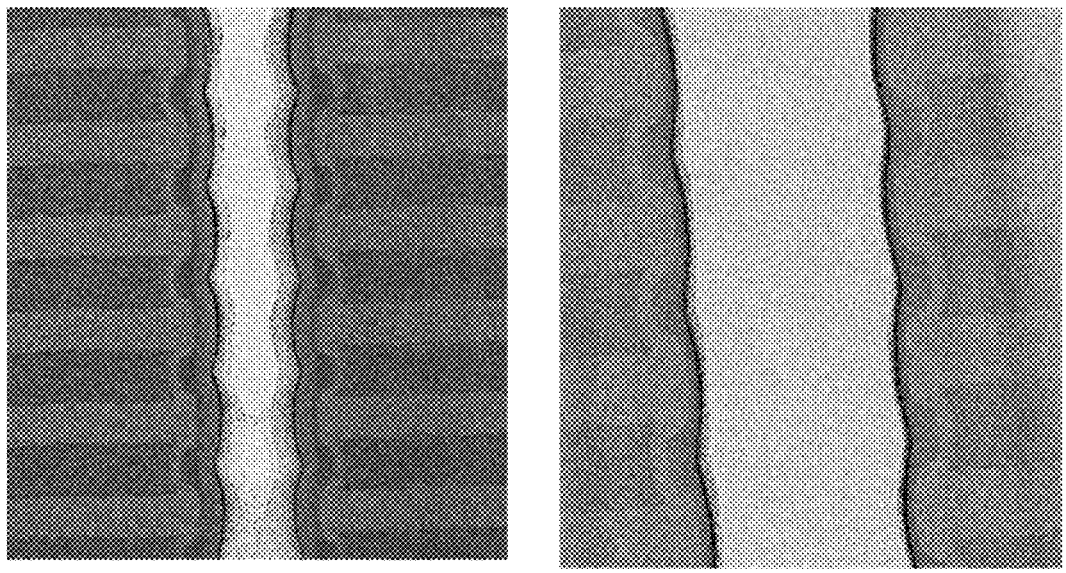
FIG. 4 illustrates electron microscopy images of a partially oxidized storage layer before and after removing the oxidized part thereof.

As illustrated in FIG. 2G, the oxidized part of storage layer 218, i.e., native oxide 219 (in FIG. 2F), is removed, which results in exposing the remainder of storage layer 218 including charge trapping structures 218A in recesses 220 (in FIG. 2D) and protecting structures 218B outside of recesses 220. Native oxide 219 can be removed by an etchant via a wet etching process. Native oxide 219 can be wet etched using any suitable etchants selective to the remainder of storage layer 218 (e.g., with a selectivity higher than about 5) until native oxide 219 is completely etched away. In some embodiments in which storage layer 218 includes silicon nitride, wet etchants including hydrofluoric acid are applied through opening 210 to selectively etch away native oxide 219 including silicon oxide, leaving the remainder of storage layer 218 including charge trapping structures 218A and protecting structures 218B. It is understood that although blocking layer 216 may include silicon oxide, the same material as native oxide 219, the continuous remainder of storage layer 218 including charge trapping structures 218A and protecting structures 218B may act as an etch stop layer to protect blocking layer 216 underneath from being etched by the etchant including hydrofluoric acid. As described above, the sidewall roughness of the remainder of storage layer 218 may be reduced due to the oxidation and wet etching processes. For example, FIG. 4 illustrates electron microscopy images of a partially oxidized storage layer before (left-side image) and after (right-side image) removing the oxidized part thereof. As shown in FIG. 4, the sidewall roughness is decreased compared with the known approach due to the oxidation and wet etching processes applied to the storage layer.

Figure 2H:
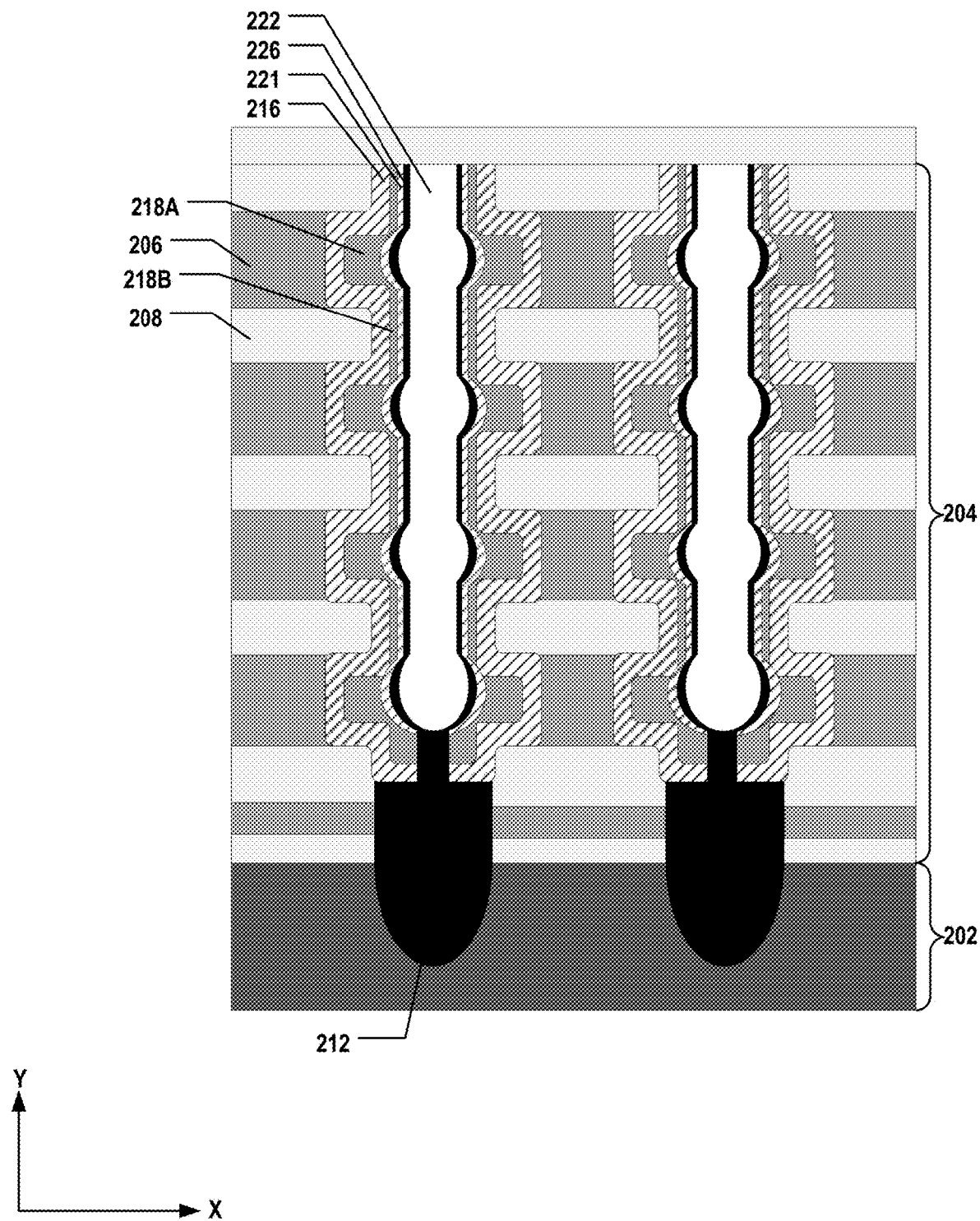
Figure 2I:
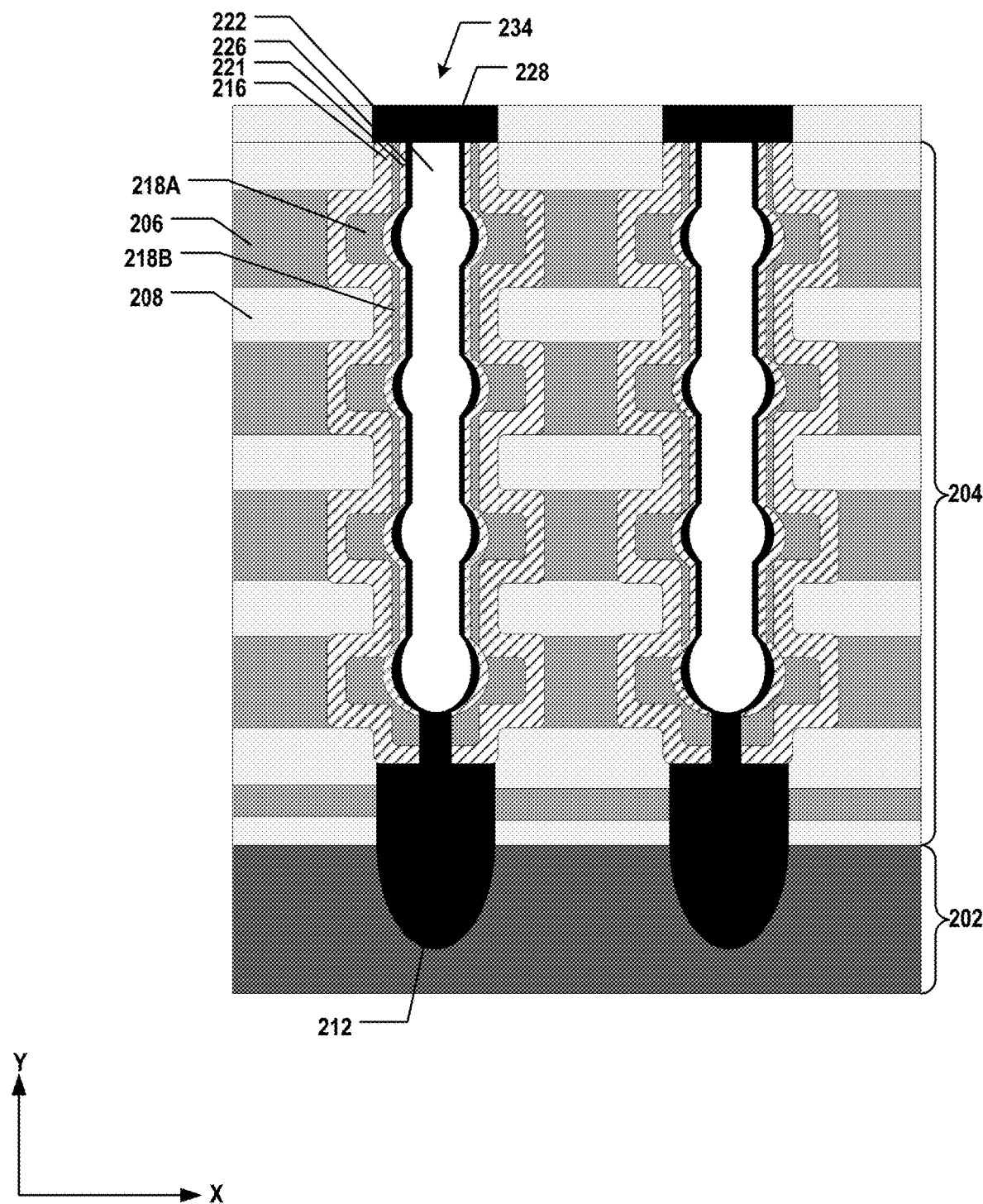

Method 300 proceeds to operation 316, as illustrated in FIG. 3, in which a tunneling layer and a semiconductor channel are sequentially formed over the remainder of the storage layer. As illustrated in FIG. 2H, a tunneling layer 221 and a semiconductor channel 226 are sequentially formed over the remainder of storage layer 218 including charge trapping structures 218A and protecting structures 218B. In some embodiments, a layer of silicon oxide and a layer of polysilicon are sequentially deposited over charge trapping structures 218A and protecting structures 218B using one or more thin film deposition processes including, but not limited to, PVD, CVD, ALD, or any combination thereof. In some embodiments, the bottom of blocking layer 216, the remainder of the storage layer 218, and tunneling layer 221 is etched through before depositing polysilicon for semiconductor channel 226, such that a bottom protruding portion of semiconductor channel 226 is in contact with single crystalline silicon plug 212. As illustrated in FIG. 2H, in some embodiments, a capping layer 222 is formed over semiconductor channel 226 to partially or fully fill opening 210 (in FIG. 2G) by depositing a layer of silicon oxide into opening 210 using one or more thin film deposition processes including, but not limited to, PVD, CVD, ALD, or any combination thereof. As illustrated in FIG. 2I, a channel plug 228 is formed above and in contact with semiconductor channel 226, for example, by etching back the top portions of semiconductor channel 226, capping layer 222, blocking layer 216, the remainder of the storage layer 218, and tunneling layer 221 and filling the etched back portions with a layer of polysilicon. As shown in FIG. 2I, a channel structure 234 including channel plug 228, single crystalline silicon plug 212, blocking layer 216, the remainder of storage layer 218, tunneling layer 221, and semiconductor channel 226 is thereby formed through dielectric stack 204, according to some embodiments.

Method 300 proceeds to operation 318, as illustrated in FIG. 3, a memory stack is formed by gate replacement. The memory stack can include interleaved conductive layers and the dielectric layers and can be formed by replacing the sacrificial layers of the dielectric stack with the conductive layers. In some embodiments, to form the memory stack, a slit opening (e.g., a gate line slit) can be formed through the dielectric stack, the sacrificial layers in the dielectric stack can be etched by applying an etchant through the slit opening to form a plurality of lateral recesses, and conductive layers can be deposited into the lateral recesses through the slit opening.

Figure 2J:
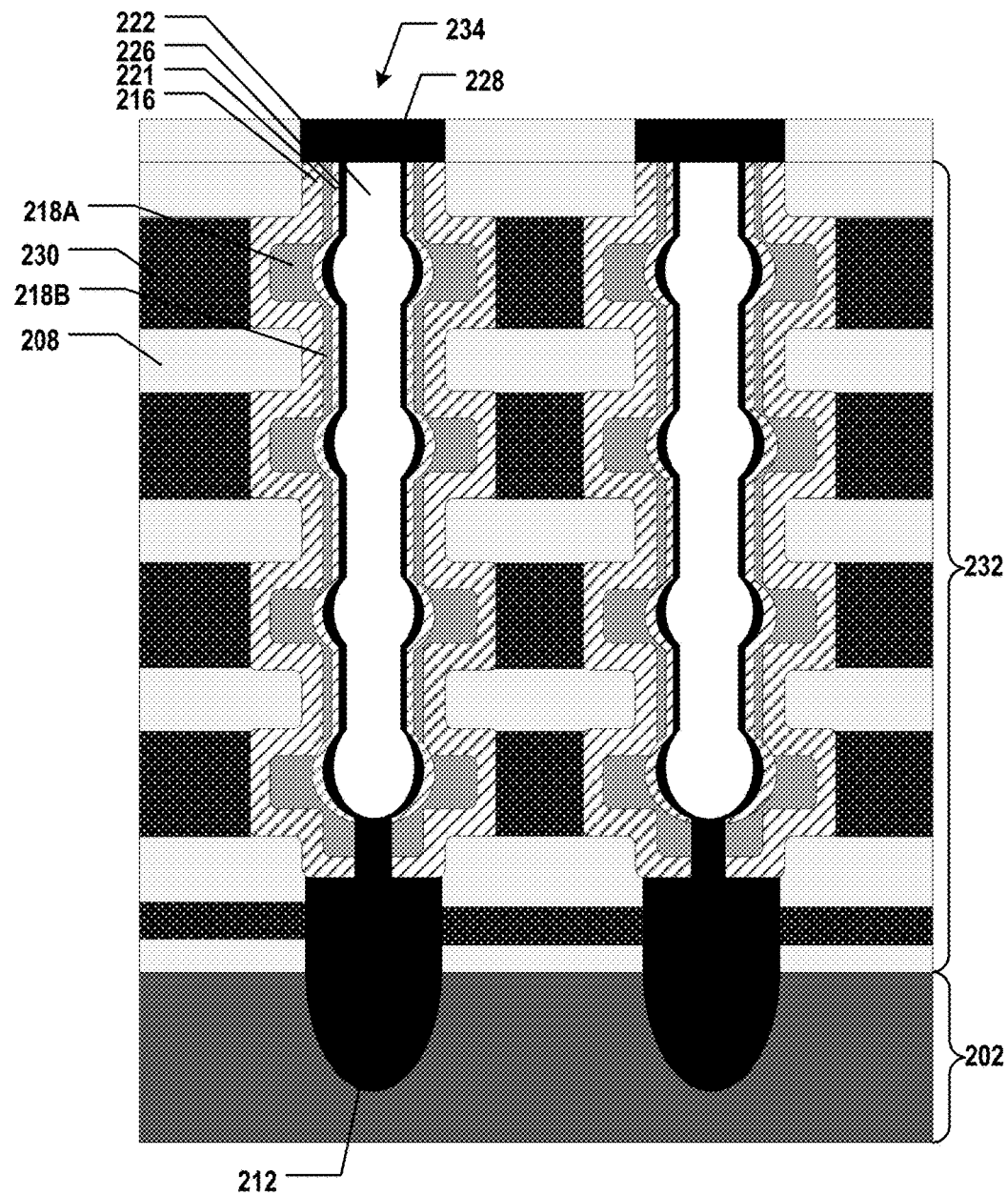

As illustrated in FIG. 2J, sacrificial layers 206 (e.g., silicon nitride layers, in FIG. 2I) are removed by, for example, wet etching, to form a plurality of lateral recesses (not shown) vertically between dielectric layers 208. In some embodiments, etchants are applied through slit openings (not shown) to selectively etch silicon nitride of sacrificial layers 206 against silicon oxide of dielectric layers 208. The etching of sacrificial layers 206 having silicon nitride can be stopped by blocking layer 216 having silicon oxide to prevent further damage to channel structure 234. Conductive layers 230 (e.g., tungsten layers) can then be deposited to fill the lateral recesses using one or more thin film deposition processes, such as CVD, PVD, ALD, electroplating, electroless plating, or any combination thereof through the slit openings. As shown in FIG. 2J, a memory stack 232 is thereby formed with interleaved conductive layers 230 and dielectric layers 208, according to some embodiments.

According to one aspect of the present disclosure, a 3D memory device includes a substrate, a memory stack disposed on the substrate and including a plurality of interleaved conductive layers and dielectric layers, and a plurality of channel structures each extending vertically through the memory stack and having a plurality of protruding portions abutting the conductive layers and a plurality of normal portions abutting the dielectric layers. Each of the plurality of channel structures includes a blocking layer along a sidewall of the channel structure, and a storage layer over the blocking layer. The storage layer includes a plurality of charge trapping structures in the protruding portions of the channel structure, and a plurality of protecting structures in the normal portions of the channel structure and connecting the plurality of charge trapping structures.

In some embodiments, the sidewall of the channel structure has a serpentine profile.

In some embodiments, a thickness of the blocking layer is nominally the same along the sidewall of the channel structure.

In some embodiments, the blocking layer includes silicon oxide.

In some embodiments, the storage layer comprises silicon nitride.

In some embodiments, the plurality of protecting structures connect the plurality of charge trapping structures such that the storage layer is continuous over the blocking layer.

In some embodiments, a thickness of each of the plurality of charge trapping structures is greater than a thickness of each of the plurality of protecting structures.

In some embodiments, the thickness of each of the plurality of protecting structures is about 2 nm to about 3 nm.

In some embodiments, the channel structure further includes a tunneling layer over the storage layer, and a semiconductor channel over the tunneling layer.

In some embodiments, the channel structure further includes a semiconductor plug disposed at a lower portion of the channel structure and electrically connected to the semiconductor channel.

According to another aspect of the present disclosure, a 3D memory device includes a substrate, a memory stack disposed on the substrate and including a plurality of interleaved conductive layers and dielectric layers, and a plurality of channel structures each extending vertically through the memory stack and having a plurality of protruding portions abutting the conductive layers and a plurality of normal portions abutting the dielectric layers. Each of the plurality of channel structures includes a blocking layer along a sidewall of the channel structure, and a storage layer over the blocking layer. The storage layer includes a plurality of charge trapping structures in the protruding portions of the channel structure, and a plurality of protecting structures in the normal portions of the channel structure. A thickness of each of the plurality of charge trapping structures is greater than a thickness of each of the plurality of protecting structures.

In some embodiments, the sidewall of the channel structure has a serpentine profile.

In some embodiments, a thickness of the blocking layer is nominally the same along the sidewall of the channel structure.

In some embodiments, the blocking layer includes silicon oxide.

In some embodiments, the storage layer comprises silicon nitride.

In some embodiments, the plurality of protecting structures connect the plurality of charge trapping structures such that the storage layer is continuous over the blocking layer.

In some embodiments, the thickness of each of the plurality of protecting structures is about 2 nm to about 3 nm.

In some embodiments, the channel structure further includes a tunneling layer over the storage layer, and a semiconductor channel over the tunneling layer.

In some embodiments, the channel structure further includes a semiconductor plug disposed at a lower portion of the channel structure and electrically connected to the semiconductor channel.

According to still another aspect of the present disclosure, a method for forming a 3D memory device is disclosed. A dielectric stack is formed above a substrate, and the dielectric stack includes a plurality of interleaved dielectric layers and sacrificial layers. An opening extending vertically through the dielectric stack is formed. Parts of the sacrificial layers abutting the opening are removed to form a plurality of recesses. A blocking layer and a storage layer are sequentially formed along sidewalls of the opening and the plurality of recesses. Part of the storage layer is oxidized. The oxidized part of the storage layer is removed, such that a remainder of the storage layer is continuous over the blocking layer.

In some embodiments, a thickness of the blocking layer is nominally the same along the sidewalls of the opening and the plurality of recesses, and a thickness of the storage layer is nominally the same along the sidewalls of the opening and the plurality of recesses.

In some embodiments, a total of the thicknesses of the blocking layer and the storage layer is nominally one half of a depth of each of the plurality of recesses.

In some embodiments, oxidizing is performed by at least one of thermal oxidation or chemical oxidation.

In some embodiments, the thermal oxidation includes ISSG.

In some embodiments, to remove the oxidized part of the storage layer, the oxidized part of the storage layer is wet etched selective to the remainder of the storage layer.

In some embodiments, the storage layer includes silicon nitride, and an etchant used by the wet etching includes hydrofluoric acid.

In some embodiments, the remainder of the storage layer includes a plurality of charge trapping structures in the plurality of recesses, and a plurality of protecting structures outside of the recesses.

In some embodiments, a thickness of each of the plurality of protecting structures is about 2 nm to about 3 nm.

In some embodiments, to remove the parts of the sacrificial layers, the parts of the sacrificial layers are wet etched selective to the dielectric layers.

In some embodiments, the sacrificial layers include silicon nitride, the dielectric layers include silicon oxide, and an etchant used by the wet etching includes phosphoric acid.

In some embodiments, after removing the oxidized part of the storage layer, a tunneling layer and a semiconductor channel are sequentially formed over the remainder of the storage layer, and a memory stack including interleaved conductive layers and the dielectric layers is formed by replacing the sacrificial layers in the dielectric stack with the conductive layers.

In some embodiments, prior to sequentially forming the blocking layer and the storage layer, a semiconductor plug is formed at a lower portion of the opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments but should be defined only in accordance with the following claims and their equivalents.

What is claimed is:

1. A three-dimensional (3D) memory device, comprising:
    a substrate;
    a memory stack disposed on the substrate and comprising a plurality of interleaved conductive layers and dielectric layers; and
    a plurality of channel structures each extending vertically through the memory stack and having a plurality of protruding portions abutting the conductive layers, and a plurality of normal portions abutting the dielectric layers, each of the plurality of channel structures comprising:
        a semiconductor channel having an inner surface and an outer surface wherein the inner surface has a plurality of first sections having a first shape and a plurality of second sections having a second shape, the first sections and the second sections being disposed alternatingly with each other wherein the first sections are in the normal portions of the channel structure, and the second sections are in the protruding portions of the channel structure and the first shape is different than the second shape;

a blocking layer along a sidewall of the channel structure; and
a storage layer over the blocking layer and comprising:
a plurality of charge trapping structures in the protruding portions of the channel structure;
a plurality of protecting structures in the normal portions of the channel structure and connecting the plurality of charge trapping structures, and
wherein a thickness of each of the plurality of charge trapping structures is greater than a thickness of each of the plurality of protecting structures.

2. The 3D memory device of claim 1, wherein the sidewall of the channel structure has a serpentine profile.

3. The 3D memory device of claim 1, wherein a thickness of the blocking layer is nominally the same along the sidewall of the channel structure.

4. The 3D memory device of claim 1, wherein the blocking layer comprises silicon oxide.

5. The 3D memory device of claim 1, wherein the storage layer comprises silicon nitride.

6. The 3D memory device of claim 1, wherein the plurality of protecting structures connect the plurality of charge trapping structures such that the storage layer is continuous over the blocking layer.

7. A three-dimensional (3D) memory device, comprising:
a substrate;
a memory stack disposed on the substrate and comprising a plurality of interleaved conductive layers and dielectric layers; and
a plurality of channel structures each extending vertically through the memory stack and having a plurality of protruding portions abutting the conductive layers, and a plurality of normal portions abutting the dielectric layers, each of the plurality of channel structures comprising:
a blocking layer along a sidewall of the channel structure; and
a storage layer over the blocking layer and comprising:
a plurality of charge trapping structures in the protruding portions of the channel structure; and
a plurality of protecting structures in the normal portions of the channel structure and connecting the plurality of charge trapping structures,
wherein a thickness of a first charge trapping structure of the plurality of charge trapping structures is greater than a thickness of a corresponding protection structure of the plurality of protecting structures.

8. The 3D memory device of claim 7, wherein the thickness of each of the plurality of protecting structures is about 2 nm to about 3 nm.

9. The 3D memory device of claim 1, wherein the channel structure further comprises a tunneling layer over the storage layer, and wherein the semiconductor channel is over the tunneling layer.

10. The 3D memory device of claim 9, wherein the channel structure further comprises a semiconductor plug disposed at a lower portion of the channel structure and electrically connected to the semiconductor channel.

11. A three-dimensional (3D) memory device, comprising:
a substrate;
a memory stack disposed on the substrate and comprising a plurality of interleaved conductive layers and dielectric layers; and
a plurality of channel structures each extending vertically through the memory stack and having a plurality of protruding portions abutting the conductive layers and a plurality of normal portions abutting the dielectric layers, each of the plurality of channel structures comprising:
a blocking layer over a sidewall of the channel structure; and
a storage layer over the blocking layer and comprising:
a plurality of charge trapping structures in the protruding portions of the channel structure; and
a plurality of protecting structures in the normal portions of the channel structure, wherein a thickness of each of the plurality of charge trapping structures is greater than a thickness of each of the plurality of protecting structures.

12. A method for forming a three-dimensional (3D) memory device, comprising:
forming a dielectric stack above a substrate, the dielectric stack comprising a plurality of interleaved dielectric layers and sacrificial layers;
forming an opening extending vertically through the dielectric stack;
removing parts of the sacrificial layers abutting the opening to form a plurality of recesses;
sequentially forming a blocking layer and a storage layer along sidewalls of the opening and the plurality of recesses;
oxidizing part of the storage layer; and
removing the oxidized part of the storage layer, such that a remainder of the storage layer is continuous over the blocking layer,
wherein a thickness of the blocking layer is nominally the same along the sidewalls of the opening and the plurality of recesses, and a thickness of the storage layer is nominally the same along the sidewalls of the opening and the plurality of recesses,
wherein a total of the thicknesses of the blocking layer and the storage layer is nominally one half of a depth of each of the plurality of recesses.

13. The method of claim 12, wherein oxidizing is performed by at least one of thermal oxidation or chemical oxidation.

14. The method of claim 13, wherein the thermal oxidation comprises in-situ steam generation.

15. A method for forming a three-dimensional (3D) memory device, comprising:
forming a dielectric stack above a substrate, the dielectric stack comprising a plurality of interleaved dielectric layers and sacrificial layers;
forming an opening extending vertically through the dielectric stack;
removing parts of the sacrificial layers abutting the opening to form a plurality of recesses;
sequentially forming a blocking layer and a storage layer along sidewalls of the opening and the plurality of recesses;
oxidizing part of the storage layer; and
removing the oxidized part of the storage layer, such that a remainder of the storage layer is continuous over the blocking layer,
wherein removing the oxidized part of the storage layer comprises wet etching the oxidized part of the storage layer selective to the remainder of the storage layer.

16. The method of claim 15, wherein the storage layer comprises silicon nitride, and an etchant used by the wet etching comprises hydrofluoric acid.

17. The method of claim 12, wherein the remainder of the storage layer comprises a plurality of charge trapping structures in the plurality of recesses, and a plurality of protecting structures outside of the recesses.

18. The method of claim 12, wherein removing the parts of the sacrificial layers comprises wet etching the parts of the sacrificial layers selective to the dielectric layers.

* * * * *